United States Patent
Shin

(10) Patent No.: US 8,731,915 B2
(45) Date of Patent: May 20, 2014

(54) METHOD AND APPARATUS TO REMOVE NOISE FROM AN INPUT SIGNAL IN A NOISY ENVIRONMENT, AND METHOD AND APPARATUS TO ENHANCE AN AUDIO SIGNAL IN A NOISY ENVIRONMENT

(75) Inventor: Sang-wook Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 549 days.

(21) Appl. No.: 12/942,069

(22) Filed: Nov. 9, 2010

(65) Prior Publication Data

US 2011/0125489 A1     May 26, 2011

(30) Foreign Application Priority Data

Nov. 24, 2009 (KR) .................. 10-2009-0114059

(51) Int. Cl.
*G10L 21/00* (2013.01)
*G10L 21/02* (2013.01)

(52) U.S. Cl.
USPC .......................... 704/225; 704/226; 704/228

(58) Field of Classification Search
USPC .................................................. 704/200–230
See application file for complete search history.

(56) References Cited

U.S. PATENT DOCUMENTS

| | | | |
|---|---|---|---|
| 6,711,258 B1 * | 3/2004 | Sung | 379/390.01 |
| 7,337,111 B2 * | 2/2008 | Vaudrey et al. | 704/225 |
| 2003/0035549 A1 | 2/2003 | Bizjak et al. | |
| 2004/0148160 A1 * | 7/2004 | Ramabadran | 704/221 |
| 2004/0218768 A1 * | 11/2004 | Zhurin et al. | 381/107 |
| 2005/0004796 A1 * | 1/2005 | Trump et al. | 704/225 |
| 2006/0271358 A1 | 11/2006 | Erell | |
| 2007/0027682 A1 * | 2/2007 | Bennett | 704/215 |
| 2007/0053528 A1 | 3/2007 | Kim et al. | |
| 2008/0162127 A1 * | 7/2008 | Laaksonen et al. | 704/225 |
| 2009/0063141 A1 * | 3/2009 | Huang | 704/226 |
| 2009/0245533 A1 * | 10/2009 | Gerlach | 381/86 |

FOREIGN PATENT DOCUMENTS

| | | |
|---|---|---|
| EP | 1538603 | 6/2005 |
| EP | 1811660 | 7/2007 |
| JP | 2007-019898 | 1/2007 |

OTHER PUBLICATIONS

European Search Report issued Mar. 15, 2011 in EP Application No. 10189888.0.

Extended European Search Report issued in Application No. 13194327.6 on Mar. 13, 2014.

* cited by examiner

Primary Examiner — Jesse Pullias
(74) Attorney, Agent, or Firm — Stanzione & Kim, LLP

(57) ABSTRACT

A method of removing noise includes detecting a frequency spectrum of a noise signal around the transmitting terminal, when an input signal which is a mixture of a voice signal and the noise signal is received, detecting a frequency spectrum of the input signal and an energy level of the voice signal, multiplying the frequency spectrum of the noise signal by a weight value that is determined based on the energy level of the voice signal to obtain a weighted noise frequency spectrum, and subtracting the weighted noise frequency spectrum from the frequency spectrum of the input signal.

21 Claims, 9 Drawing Sheets

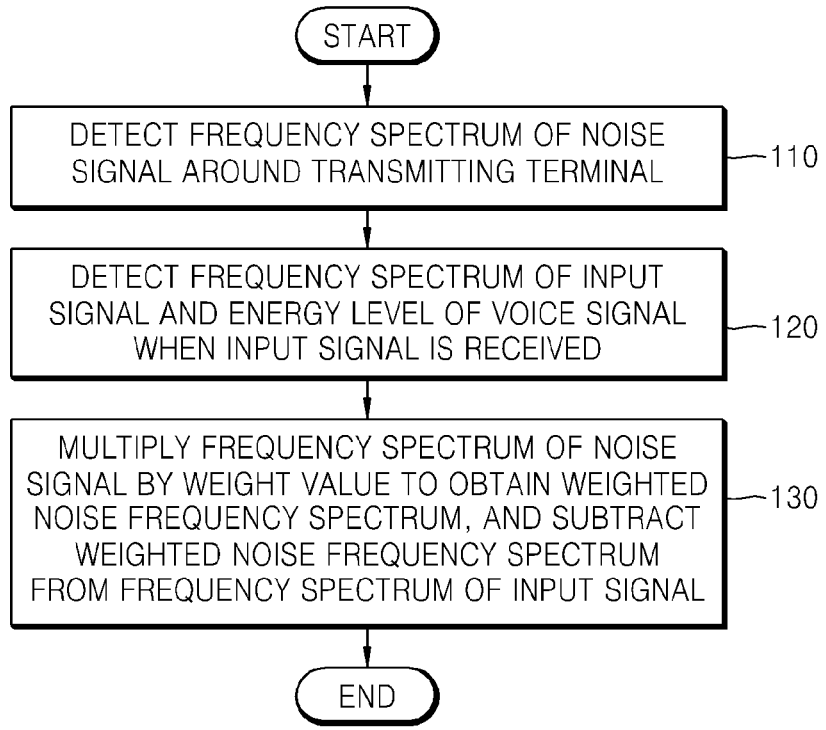
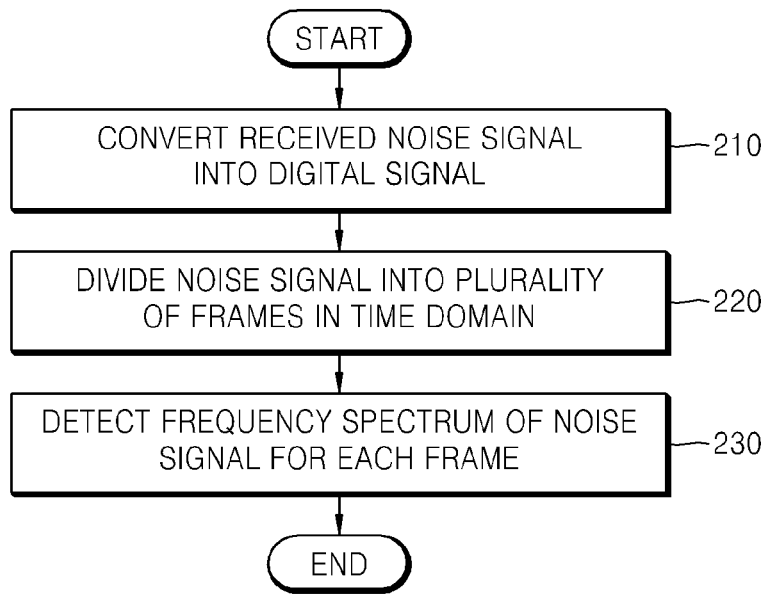

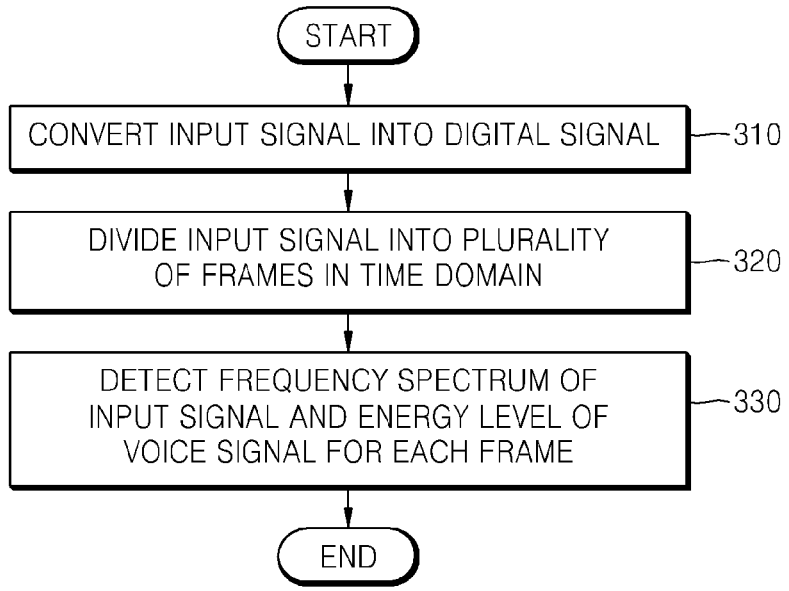
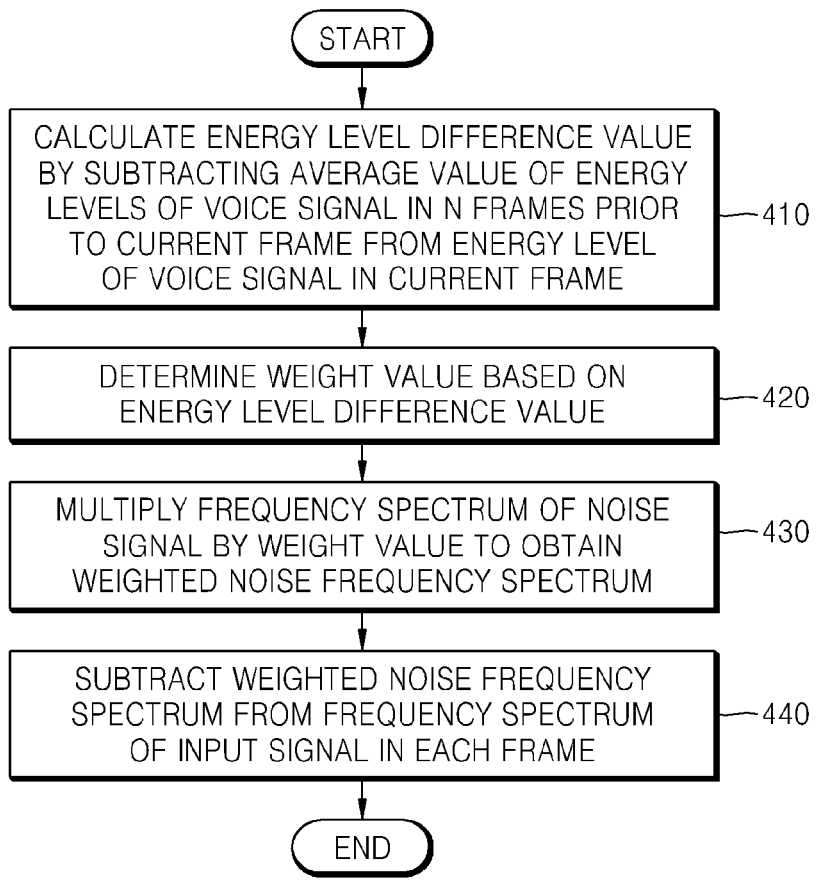

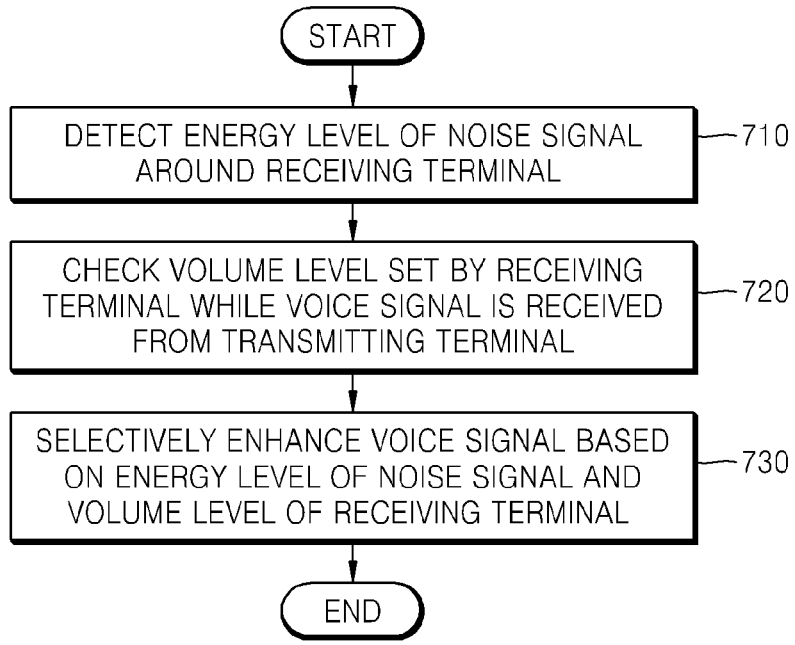
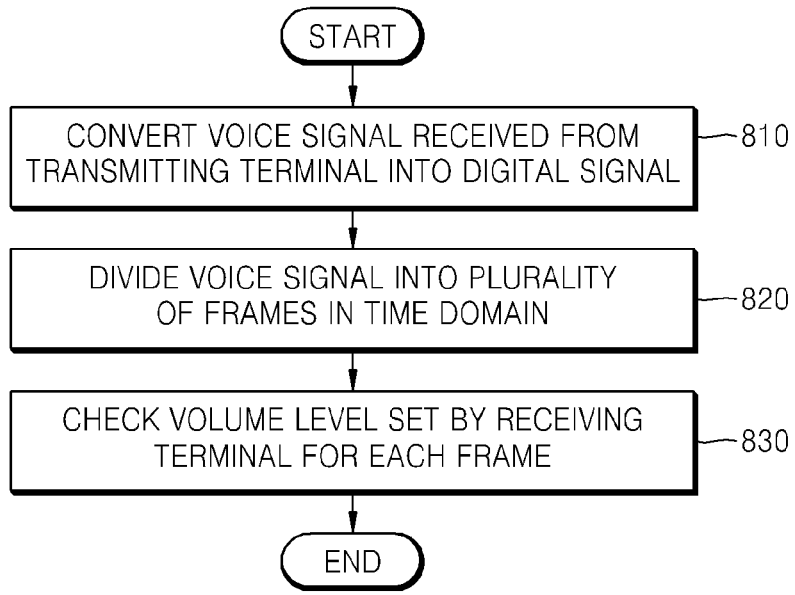

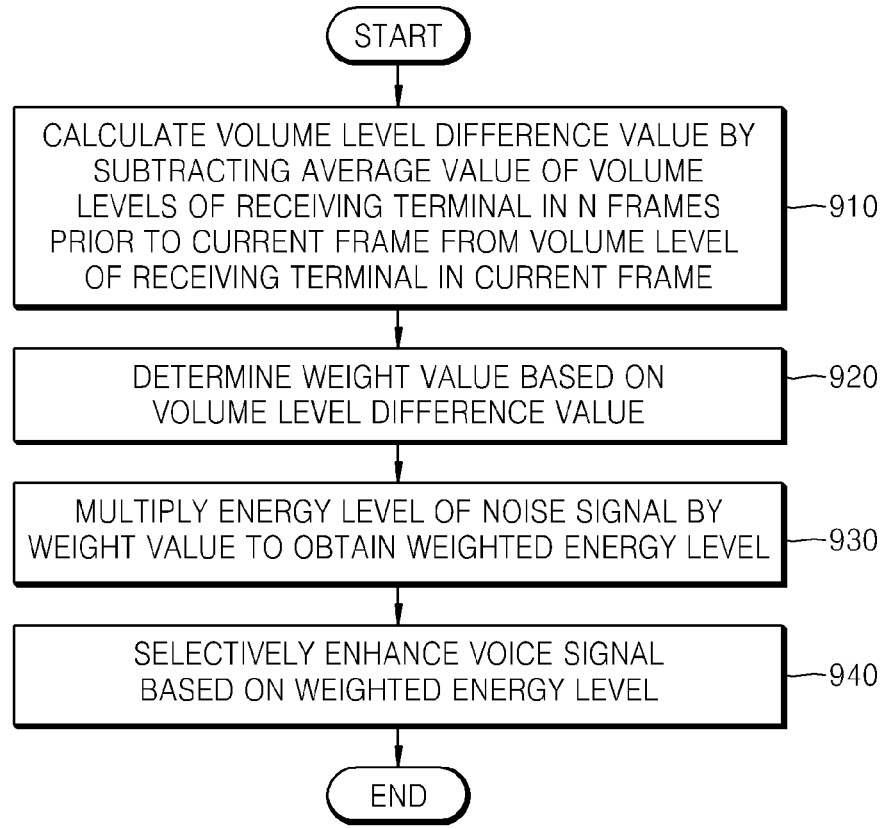
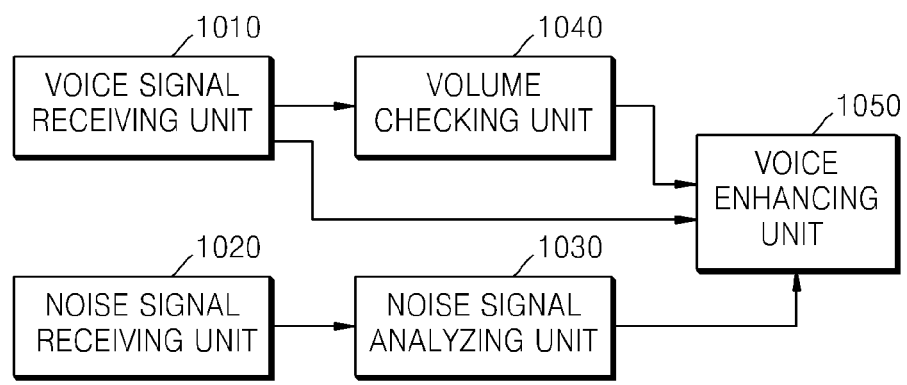

METHOD AND APPARATUS TO REMOVE NOISE FROM AN INPUT SIGNAL IN A NOISY ENVIRONMENT, AND METHOD AND APPARATUS TO ENHANCE AN AUDIO SIGNAL IN A NOISY ENVIRONMENT

CROSS-REFERENCE TO RELATED APPLICATIONS

This application claims the benefit of priority under Korean Patent Application No. 10-2009-0114059, filed on Nov. 24, 2009, in the Korean Intellectual Property Office, the disclosure of which is incorporated by reference herein in its entirety.

BACKGROUND

1. Field of the Invention

The present general inventive concept relates to a method and apparatus to remove noise from an input signal in a noisy environment and a method and apparatus to enhance a voice signal in a noisy environment.

2. Description of the Related Art

When a voice signal is received in a noisy environment, a noise signal is received along with the voice signal. Attempts have been made to remove the noise signal received along with the voice signal by removing a frequency spectrum of the noise signal from a frequency spectrum of the voice signal.

SUMMARY

The present general inventive concept provides a method and apparatus to remove noise from an input signal in a noisy environment, and a method and apparatus to enhance a voice signal in a noisy environment.

Additional features and utilities of the present general inventive concept will be set forth in part in the description which follows and, in part, will be obvious from the description, or may be learned by practice of the general inventive concept.

Features and/or utilities of the present general inventive concept may be realized by a method of removing noise included in an input signal received by a transmitting terminal, the method being performed by the transmitting terminal in a noisy environment, the method including detecting a frequency spectrum of a noise signal around the transmitting terminal, detecting a frequency spectrum of the input signal and an energy level of the voice signal when an input signal which is a mixture of a voice signal and the noise signal is received, multiplying the frequency spectrum of the noise signal by a weight value that is determined based on the energy level of the voice signal to obtain a weighted noise frequency spectrum, and subtracting the weighted noise frequency spectrum from the frequency spectrum of the input signal.

The detecting of the energy level of the voice signal may include detecting an energy level of the input signal.

The detecting of the frequency spectrum of the input signal and the energy level of the voice signal may include dividing the input signal into a plurality of frames in a time domain and detecting the frequency spectrum of the input signal and the energy level of the voice signal for each of the plurality of frames.

The subtracting of the weighted noise frequency spectrum from the frequency spectrum of the input signal may include calculating an energy level difference value by subtracting an average value of energy levels of the voice signal in N frames prior to a current frame from an energy level of the voice signal in the current frame, determining the weight value based on the energy level difference value; multiplying the frequency spectrum of the noise signal by the weight value to obtain the weighted noise frequency spectrum, and subtracting the weighted noise frequency spectrum from the frequency spectrum of the input signal in each of the plurality of frames.

The weight value may increase as the energy level difference value increases and may be set to 1 when the energy level difference value is equal to or less than a threshold value.

The detecting of the frequency spectrum of the noise signal around the transmitting terminal may include dividing the noise signal into a plurality of frames in a time domain and detecting the frequency spectrum of the noise signal for each of the plurality of frames.

Features and/or utilities of the present general inventive concept may be realized by a method of enhancing a voice signal received from a transmitting terminal, the method being performed by a receiving terminal in a noisy environment, the method including detecting an energy level of a noise signal around the receiving terminal, checking a volume level set by the receiving terminal while the voice signal is received from the transmitting terminal, and selectively enhancing the voice signal based on the energy level of the noise signal and the volume level.

The checking of the volume level set by the receiving terminal may include dividing the voice signal into a plurality of frames in a time domain and checking the volume level set by the receiving terminal for each of the plurality of frames.

The selectively enhancing of the voice signal may include calculating a volume level difference value by subtracting an average value of volume levels of the receiving terminal in N frames prior to a current frame from a volume level of the receiving terminal in the current frame, determining a weight value based on the volume level difference value, multiplying the energy level of the noise signal by the weight value to obtain a weighted energy level, and selectively enhancing the voice signal based on the weighted energy level.

The weight value may increase as the volume level difference value increases and may be set to 1 when the volume level difference value is equal to or less than a threshold value.

The selectively enhancing of the voice signal may include enhancing the voice signal when the weighted energy level exceeds a threshold value and enhancing the voice signal at a rate preset according to the weighted energy level.

Features and/or utilities of the present general inventive concept may also be realized by an apparatus to remove noise included in an input signal received in a noisy environment, the apparatus including a receiving unit to receive a noise signal and an input signal that is a mixture of a voice signal and the noise signal, a noise signal analyzing unit to detect a frequency spectrum of the noise signal, an input signal analyzing unit to detect a frequency spectrum of the input signal and an energy level of the voice signal, and a noise removing unit to multiply the frequency spectrum of the noise signal by a weight value that is determined based on the energy level of the voice signal to obtain a weighted noise frequency spectrum and subtracting the weighted noise frequency spectrum from the frequency spectrum of the input signal.

The noise removing unit may include an energy level difference value calculating unit to calculate an energy level difference value by subtracting an average value of energy levels of the voice signal in N frames prior to a current frame from an energy level of the voice signal in the current frame, where N is a whole number greater than zero, a weight value determining unit to determine the weight value based on the energy level difference value, a multiplying unit to multiply the frequency spectrum of the noise signal by the weight value to obtain the weighted noise frequency spectrum, and a subtracting unit to subtract the weighted noise frequency spectrum from the frequency spectrum of the input signal in each of the plurality of frames.

Features and/or utilities of the present general inventive concept may also be realized by a receiving terminal to enhance a voice signal received from a transmitting terminal in a noise environment, the receiving terminal including a voice signal receiving unit to receive a voice signal from the transmitting terminal, a noise signal receiving unit to receive a noise signal around the receiving terminal, a noise signal analyzing unit to detect an energy level of the noise signal, a volume checking unit to check a volume level set by the receiving terminal while the voice signal is received, and a voice enhancing unit to selectively enhance the voice signal based on the energy level of the noise signal and the volume level.

The voice enhancing unit may include a volume level difference value calculating unit to calculate a volume level difference value by subtracting an average value of volume levels of the receiving terminal in N frames prior to a current frame from a volume level of the receiving terminal in the current frame, a weight value determining unit to determine a weight value based on the volume level difference value, a multiplying unit to multiply the energy level of the noise signal by the weight value to obtain a weighted energy level, and a signal enhancing unit to selectively enhance the voice signal based on the weighted energy level.

Features and/or utilities of the present general inventive concept may also include a computer-readable recording medium having embodied thereon a program to execute a method of removing noise included in an input signal received by a transmitting terminal, the method being performed by the transmitting terminal in a noisy environment, the method including detecting a frequency spectrum of a noise signal around the transmitting terminal, detecting a frequency spectrum of the input signal and an energy level of the voice signal when an input signal which is a mixture of a voice signal and a noise signal is received, multiplying the frequency spectrum of the noise signal by a weight value that is determined based on the energy level of the voice signal to obtain a weighted noise frequency spectrum, and subtracting the weighted noise frequency spectrum from the frequency spectrum of the input signal.

Features and/or utilities of the present general inventive concept may also be realized by a computer-readable recording medium having embodied thereon a program to execute a method of enhancing a voice signal received from a transmitting terminal, the method being performed by a receiving terminal in a noisy environment, the method including detecting an energy level of a noise signal around the receiving terminal, checking a volume level set by the receiving terminal while the voice signal is received from the transmitting terminal, and selectively enhancing the voice signal based on the energy level of the noise signal and the volume level.

Features and/or utilities of the present general inventive concept may also be realized by a method of generating a sound signal, the method including receiving an audio signal at a receiver, determining an ambient sound level around the receiver, determining an output volume level of the receiver, and outputting the audio signal as a sound signal based on the ambient sound level and the determined output volume level.

The audio signal may include a voice signal.

Determining the ambient sound level may include receiving an ambient sound signal from a microphone connected to the receiver.

Determining an output volume level of the receiver may include detecting a volume setting set by a user of the receiver.

Outputting the audio signal may include determining if the ambient sound level exceeds a first predetermined threshold and increasing an energy level of the audio signal if it is determined that the ambient sound level exceeds the first predetermined threshold.

Outputting the audio signal may include determining if the output volume level exceeds a second predetermined threshold and increasing the energy level of the audio signal if it is determined that the output volume level exceeds the second predetermined threshold.

Determining if the output volume level exceeds a second predetermined threshold may include dividing the sound signal into a plurality of frames in the time domain, determining an energy level of a first frame, and determining an average energy level of a plurality of second frames that precede the first frame in the time domain to calculate the second threshold.

Increasing the energy level of the audio signal may include multiplying the audio signal by a weight value greater than 1 if it is determined that the output volume exceeds the second predetermined threshold.

An audio signal receiver including an audio signal input to receive an audio signal, an ambient sound input to receive a signal corresponding to an ambient sound around the receiver, a volume detector to detect a set volume of the receiver, and an audio signal enhancing unit to enhance the audio signal based on the ambient sound and the set volume of the receiver.

The ambient sound input receives the signal corresponding to the ambient sound from a microphone connected to the audio signal receiver.

The audio signal enhancing unit may include an energy level difference calculating unit to compare an energy level of the audio signal at a first time with an energy level of the audio signal at a previous time, a weight value determining unit to compare the determined energy level difference with a predetermined threshold and to output a weight value greater than 1 if the energy level difference exceeds the predetermined threshold, a multiplying unit to multiply an energy level of the ambient sound signal by the weight value, and a signal enhancing unit to multiply the audio signal by the weighted energy level of the ambient sound signal.

BRIEF DESCRIPTION OF THE DRAWINGS

The above and other features and utilities of the present general inventive concept will become more apparent by describing in detail exemplary embodiments thereof with reference to the attached drawings in which:

FIG. 1 is a flowchart illustrating a method of removing noise according to an embodiment of the present general inventive concept;

FIG. 2 is a flowchart illustrating a method of detecting a frequency spectrum of a noise signal, according to an embodiment of the present general inventive concept;

FIG. 3 is a flowchart illustrating a method of detecting a frequency spectrum of an input signal and an energy level of a voice signal according to an embodiment of the present general inventive concept;

FIG. 4 is a flowchart illustrating a method of subtracting a frequency spectrum of a noise signal from a frequency spectrum of an input signal according to an embodiment of the present general inventive concept;

FIG. 7 is a flowchart illustrating a method of enhancing a voice signal according to an embodiment of the present general inventive concept;

FIG. 8 is a flowchart illustrating a method of checking a volume level of a receiving terminal according to an embodiment of the present general inventive concept;

FIG. 9 is a flowchart illustrating a method of enhancing a voice signal according to another embodiment of the present general inventive concept;

FIG. 10A is a block diagram of a receiving terminal to enhance a voice signal received from a transmitting terminal according to an embodiment of the present general inventive concept;

DETAILED DESCRIPTION OF THE EMBODIMENTS

Figure 5:
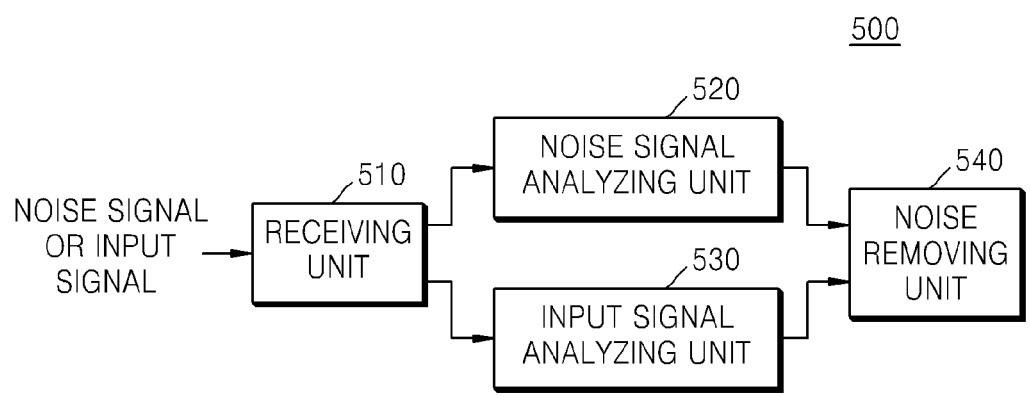
FIG. 5 is a block diagram of an apparatus to remove noise according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a flowchart illustrating a method of removing noise, according to an embodiment of the present general inventive concept. It is assumed that a user inputs his/her voice to a transmitting terminal in a noisy environment.

In operation 110, a frequency spectrum of a noise signal around the transmitting terminal is detected.

The noise signal around the transmitting terminal refers to a noise signal received by the transmitting terminal around the transmitting terminal before the user inputs his/her voice to the transmitting terminal. In other words, the noise signal may refer to an ambient or environmental noise in the vicinity of the transmitting terminal.

Operation 110 will be explained later with reference to FIG. 2 in detail.

In operation 120, when an input signal that is a mixture of a voice signal and a noise signal is received, the frequency spectrum of the input signal and an energy level of the voice signal are detected.

The energy level of the voice signal may be detected by detecting an energy level of the input signal. That is, although the input signal is the mixture of the voice signal and the noise signal, since the energy level of the voice signal is much higher than an energy level of the noise signal, even though the energy level of the input signal is detected and then is used as the energy level of the voice signal, a difference between the energy level of the input signal and the energy level of the voice signal is very small. For example, since the user inputs his/her voice by keeping a microphone of the transmitting terminal very close to his/her mouth even when an area around the transmitting terminal is very noisy, the energy level of the voice signal is much higher than the energy level of the noise signal.

However, a method of detecting an energy level of a voice signal is not limited thereto, and any technology capable of calculating an energy level of a voice signal from an input signal that is a mixture of the voice signal and a noise signal may be used.

The noise signal included in the input signal may have a frequency spectrum similar to or different from that of the noise signal received by the transmitting terminal in operation 110. For example, if the noise signal received by the transmitting terminal in operation 110 is a static noise signal, the noise signal received by the transmitting terminal in operation 110 and the noise signal included in the input signal may have similar frequency spectrums. However, if the noise signal received by the transmitting terminal in operation 110 is a non-static noise signal, the noise signal received by the transmitting terminal in operation 110 and the noise signal included in the input signal may have different frequency spectrums. Here, a frequency spectrum of an input signal refers to a level of an input signal at each frequency in a frequency domain. Operation 120 will be explained later with reference to FIG. 3 in detail.

In operation 130, the frequency spectrum of the noise signal is multiplied by a weight value that is determined based on the energy level of the voice signal to obtain a weighted noise frequency spectrum, and the weighted noise frequency spectrum is subtracted from the frequency spectrum of the input signal.

Since the frequency spectrum of the noise signal is increased when the frequency spectrum of the noise signal is multiplied by the weight value, if the weighted noise frequency spectrum is subtracted from the frequency spectrum of the input signal, the noise signal can be more effectively removed from the input signal.

Here, the weight value may be determined in various ways.

For example, a plurality of threshold values may be determined for the energy level of the voice signal, and a weight value corresponding to each of the threshold values may be predetermined. In detail, if the energy level of the voice signal is less than a first threshold value, the weight value may be 1, and if the energy level of the voice signal is greater than the first threshold value, the weight value may be 1.1. If the energy level of the voice signal is greater than a second threshold value, the weight value may be 1.2, and if the energy level of the voice signal is greater than a third threshold value, the weight value may be 1.3. However, the number of threshold values and the weight value are not limited to the above values.

The reason why the weight value increases as the energy level of the voice signal increases is to increase the frequency spectrum of the noise signal to be removed from the frequency spectrum of the voice signal as the energy level of the voice signal is increased since the fact that the energy level of the voice signal is increased may mean that the amount of noise around the transmitting terminal is increased or the user raises his/her voice when he/she feels that an area around the transmitting terminal is noisy. When the noise signal is a non-static noise signal, since the method of FIG. 1 does not newly calculate the frequency spectrum of the noise signal but increases the frequency spectrum of the noise signal which is previously detected, the non-static noise signal can be more effectively removed from the input signal according to a change in the noisy environment of the transmitting terminal.

The weight value may be determined in other ways as will be described later with reference to FIG. 4.

FIG. 2 is a flowchart illustrating a method of detecting a frequency spectrum of a noise signal according to an embodiment of the present general inventive concept.

In operation 210, a noise signal is converted into a digital signal.

Here, the noise signal that is converted into the digital signal is a noise signal that is received before an input signal is received.

In operation 220, the noise signal is divided into a plurality of frames in a time domain.

The noise signal may be divided in units of several or tens of msecs, and thus the plurality of frames each having a length of several or tens of msecs may be generated.

In operation 230, a frequency spectrum of the noise signal is detected for each of the frames. In order to detect the frequency spectrum of the noise signal, a process of transforming the noise signal into a frequency domain signal needs to be performed. The process of transforming the noise signal into the frequency domain signal may be performed using Fast Fourier Transformation (FFT).

FIG. 3 is a flowchart illustrating a method of detecting a frequency spectrum of an input signal and an energy level of a voice signal according to an embodiment of the present general inventive concept.

In operation 310, an input signal is converted into a digital signal.

In operation 320, the input signal is divided into a plurality of frames in a time domain.

The input signal may be divided in units of several or tens of msecs, and thus the plurality of frames each having a length of several or tens of msecs may be generated.

In operation 330, a frequency spectrum of the input signal and an energy level of a voice signal are detected for each of the frames. In order to detect the frequency spectrum of the input signal, a process of transforming the input signal into a frequency domain signal needs to be performed. The process of transforming the input signal into the frequency domain signal may be performed using FFT.

FIG. 4 is a flowchart illustrating a method of subtracting a frequency spectrum of a noise signal from a frequency spectrum of an input signal, according to an embodiment of the present general inventive concept.

It is assumed that a frequency spectrum of an input signal and an energy level of a voice signal have already been detected.

In operation 410, an energy level difference value is calculated by subtracting an average value of energy levels of the voice signal in N frames prior to a current frame from an energy level of the voice signal in the current frame.

Here, the current frame is a time interval including an input signal that is being currently received. For example, if the input signal is already divided into N frames and an input signal that is being currently received corresponds to an $N+1^{th}$ frame, the current frame may be an $N+1^{th}$ frame.

The energy level difference value may be defined by Equation 1.

$$E_d = |S(N+1)|^2 - \frac{1}{N}\sum_{X=1}^{N}|S(X)|^2 \quad \text{[Equation 1]}$$

where $S(N+1)$ is a frequency spectrum of the input signal in a current frame, e.g., an $N+1^{th}$ frame, $|S(N+1)|^2$ is an energy level of the input signal of the current frame, and the portion:

$$\frac{1}{N}\sum_{X=1}^{N}|S(X)|^2$$

is an average value of energy levels of the input signal from a first frame to an $N^{th}$ frame. The reason why the energy level of the input signal instead of the energy level of the voice signal is used in Equation 1 is that when the energy level of the voice signal needs to be calculated, the energy level of the input signal is calculated and then is used as the energy level of the voice signal as described above. Accordingly, $|S(N+1)|^2$ may be an energy level of the voice signal of a current frame and $$\frac{1}{N}\sum_{X=1}^{N}|S(X)|^2$$

may be an average value of energy levels of the voice signal from a first frame to an $N^{th}$ frame.

When $|S(N+1)|^2$ is Ep and $$\frac{1}{N}\sum_{X=1}^{N}|S(X)|^2$$

is Eavg, the energy level difference value may be defined by Equation 2 on a log scale.

$$E_{dlog} = \log_2\left(\frac{Ep}{Eavg}\right) \quad \text{[Equation 2]}$$

In operation 420, a weight value is determined based on the energy level difference value.

The weight value increases as the energy level difference value increases, and may be set to 1 when the energy level difference value is less than a threshold value.

For example, if the energy level difference value is defined by Equation 2 on a log scale, the weight value may be defined by Equation 3.

$W=1 (E_{dlog}<Th)$ $W=1.1 (E_{dlog}=1)$ $W=1.2 (E_{dlog}=2)$ $W=1.3 (E_{dlog}=3)$ [Equation 3]

Referring to Equation 3, if an energy level difference value $E_{dlog}$ is less than a threshold value Th, the weight value is set to 1, if the energy level difference value $E_{dlog}$ is 1, the weight value is set to 1.1, if the energy level difference value $E_{dlog}$ is 2, the weight value is set to 1.2, and if the energy level difference value $E_{dlog}$ is 3, the weight value is set to 1.3.

In operation 430, the frequency spectrum of the noise signal is multiplied by the weight value to obtain a weighted noise frequency spectrum.

The weighted noise frequency spectrum may be defined by Equation 4.

$H'(f)=W \times H(f)$ [Equation 4]

where f is a frequency, H(f) is the frequency spectrum of the noise signal, and H'(f) is the weighted noise frequency spectrum.

In operation 440, the weighted noise frequency spectrum is subtracted from the frequency spectrum of the input signal in each of the frames.

Operation 440 may be defined by Equation 5.

$$S'(f)=S(f)-H'(f) \quad \text{[Equation 5]}$$

where S(f) is the frequency spectrum of the input signal, H'(f) is the weighted noise frequency spectrum, and S'(f) is the frequency spectrum of the input signal from which noise is removed.

Since the weighted noise frequency spectrum is removed from the frequency spectrum of the input signal in each of the frames in operation 440, when an input signal having improved quality is finally generated, the input signal is transformed into a time domain signal again, to thereby completely remove noise from the input signal.

FIG. 5 is a block diagram of an apparatus to remove noise 500 according to an embodiment of the present general inventive concept. Referring to FIG. 5, the apparatus 500 includes a receiving unit 510, a noise signal analyzing unit 520, an input signal analyzing unit 530, and a noise removing unit 540.

The receiving unit 510 receives a noise signal or an input signal that is a mixture of a voice signal and the noise signal. The receiving unit 510 may include one or more wired ports or wireless antenna to receive the noise signal or the input signal. The receiving unit 510 may include one or more signal filters to separate the noise signal from the input signal.

The noise signal analyzing unit 520 detects a frequency spectrum of the noise signal and may include one or more signal filters and other supporting circuitry to receive the noise signal and to determine the strength of the noise signal over a range of frequency bands.

The input signal analyzing unit 530 detects a frequency spectrum of the input signal and an energy level of the voice signal. The input signal analyzing unit 530 may include one or more signal filters and other supporting circuitry to receive the input signal and to determine the strength of the input signal over a range of frequency bands.

As described above, the input signal analyzing unit 530 may detect an energy level of the input signal and then may use the energy level of the input signal as the energy level of the voice signal. The energy level of the input signal may correspond to an amplitude, frequency, or change in amplitude or frequency of the input signal, for example.

The noise removing unit 540 multiplies the frequency spectrum of the noise signal by a weight value that is determined based on the energy level of the voice signal to obtain a weighted noise frequency spectrum, and then subtracts the weighted noise frequency spectrum from the frequency spectrum of the input signal.

Figure 6:
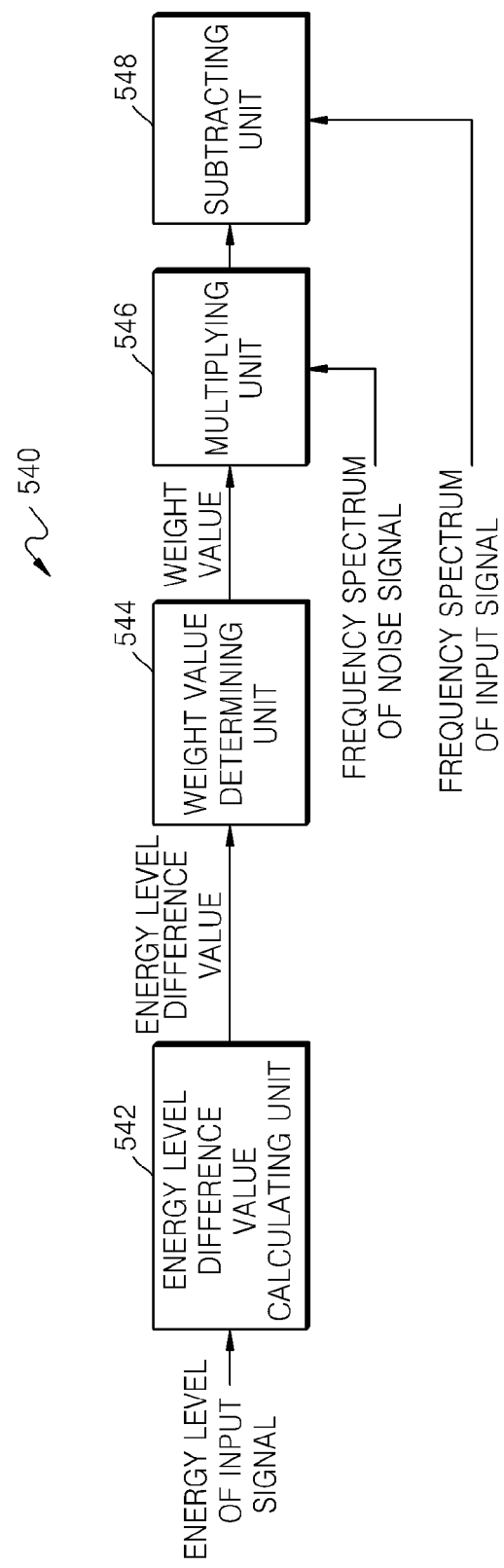
FIG. 6 is a block diagram illustrating operation of the noise removing unit of the apparatus of FIG. 5.

FIG. 6 is a block diagram illustrating the operation of the noise removing unit 540 of the apparatus of FIG. 5.

Referring to FIG. 6, the noise removing unit 540 includes an energy level difference calculating unit 542, a weight value determining unit 544, a multiplying unit 546, and a subtracting unit 548.

The energy level difference calculating unit 542 calculates an energy level difference value by subtracting an average value of energy levels of the voice signal in N frames prior to a current frame from an energy level of the voice signal in the current frame, where N is a number greater than zero.

The weight value determining unit 544 determines a weight value based on the energy level difference value.

The multiplying unit 546 multiples the frequency spectrum of the noise signal by the weight value to obtain a weighted noise frequency spectrum.

The subtracting unit 548 subtracts the weighted noise frequency spectrum from the frequency spectrum of the input signal in each of the frames.

The noise removing unit 540 may include one or more processors, memory, and signal filters and may be controlled by an external processor or controller.

A method and apparatus to remove noise from an input signal in a transmitting terminal has been described above. A method of enhancing a voice signal in a receiving terminal that receives the voice signal from the transmitting terminal will now be explained.

FIG. 7 is a flowchart illustrating a method of enhancing a voice signal according to an embodiment of the present general inventive concept.

In operation 710, an energy level of a noise signal around the receiving terminal is detected. The noise signal around the receiving terminal may be generated by the ambient noise or the environmental noise around the receiving terminal.

The noise signal around the receiving terminal may be received through a microphone of the receiving terminal, for example. Since a process of detecting the energy level of the noise signal around the receiving terminal includes detecting a frequency spectrum of the noise signal and then calculating an energy level of the frequency spectrum as described with reference to FIG. 2, a detailed explanation thereof will not be given.

In operation 720, a volume level set by the receiving terminal is checked while a voice signal is received from the transmitting terminal.

The reason why the volume level is checked by the receiving terminal is that a user tends to increase a volume level in order to listen to a voice signal received from a transmitting terminal when he/she feels that an area around the transmitting terminal is very noisy. The volume level of the receiving terminal may be checked periodically. The voice signal received from the transmitting terminal in operation 720 may be a voice signal from which noise is removed.

Operation 720 will be explained later with reference to FIG. 8 in detail.

In operation 730, the voice signal is selectively enhanced based on the energy level of the noise signal and the volume level of the receiving terminal.

Only an energy level of a noise signal has been considered when enhancing a voice signal in a conventional art. However, since the method of FIG. 7 considers both the energy level of the noise signal and the volume level of the receiving terminal, the voice signal can be enhanced by reflecting a subjective element, that is, the volume level of the receiving terminal set by the user, in addition to an objective element, that is, the energy level of the noise signal around the receiving terminal.

Operation 730 and the effect thereof will be explained later with reference to FIG. 9 in detail.

FIG. 8 is a flowchart illustrating a method of checking a volume level of a receiving terminal according to an embodiment of the present general inventive concept.

In operation 810, a voice signal received from a transmitting terminal is converted into a digital signal.

In operation 820, the voice signal is divided into a plurality of frames in a time domain.

In operation 830, a volume level set by the receiving terminal is checked for each of the frames.

FIG. 9 is a flowchart illustrating a method of enhancing a voice signal according to an embodiment of the present general inventive concept.

In operation 910, a volume level difference value is calculated by subtracting an average value of volume levels of a receiving terminal in N frames prior to a current frame from a volume level of the receiving terminal in the current frame, where N is a number greater than zero.

The volume level difference value may be defined by Equation 6.

$$V_d = V(N+1) - \frac{1}{N}\sum_{X=1}^{N} |V(X)|^2 \quad \text{[Equation 6]}$$

where $V(N+1)$ is a volume level of the receiving terminal in a current frame, e.g., an $N+1^{th}$ frame, and $$\frac{1}{N}\sum_{X=1}^{N} |V(X)|^2$$

is an average value of volume levels of the receiving terminal from a first frame to an $N^{th}$ frame.

It is assumed that the volume level of the receiving terminal is normalized. For example, the volume level of the receiving terminal may range from 0 to 10.

In operation 920, a weight value is determined based on the volume level difference value.

The weight value that is determined based on the volume level difference value is a volume weight value Wv, unlike the weight value of FIGS. 1 through 6.

The volume weight value Wv increases as the volume level difference value increases, and may be set to 1 when the volume level difference value is equal to or less than a threshold value.

For example, the volume weight value Wv may be defined by Equation 7.

$$Wv=1 (V_d \leq 1)$$

$$Wv=1.2 (V_d=2)$$

$$Wv=1.4 (V_d=3)$$

$$Wv=1.6 (V_d=4) \quad \text{[Equation 7]}$$

Referring to Equation 7, if a volume level difference value Vd is equal to or less than 1 that is a threshold value Thv, the volume weight value Wv is set to 1. If the volume level difference value Vd is 2, the volume weight value Wv is set to 1.2. If the volume level difference value Vd is 3, the volume weight value Wv is set to 1.4. If the volume level difference value Vd is 4, the volume weight value Wv is set to 1.6. In operation 930, the energy level of the noise signal is multiplied by the volume weight value Wv to obtain a weighted energy level.

The weighted energy level may be defined by Equation 8.

$$E'_N = Wv \times E_N \quad \text{[Equation 8]}$$

where $E_N$ is the energy level of the noise signal, and $E'_N$ is the weighted energy level of the noise signal. In operation 940, the voice signal is selectively enhanced based on the weighted energy level.

When the voice signal is enhanced as shown in operation 940, a voice enhancement weight value We that is determined based on the weighted energy level $E'_N$ of the noise signal may be used. A process of enhancing the voice signal using the voice enhancement weight value We may be expressed as Equation 9.

$$S'(f) = We \times S(f)$$

$$We=1 (E'_N \leq 10 \text{ dB})$$

$$We=1.1 (E'_N \leq 15 \text{ dB})$$

$$We=1.2 (E'_N \leq 20 \text{ dB})$$

$$We=1.3 (E'_N \leq 25 \text{ dB}) \quad \text{[Equation 9]}$$

where $S(f)$ is a frequency spectrum of the voice signal, and $S'(f)$ is a frequency spectrum of the voice signal which is multiplied by the voice enhancement weight value We. Once the frequency spectrum of the voice signal is multiplied by the voice enhancement weight value We exceeding 1, the voice signal is enhanced.

Referring to Equation 9, if the weighted energy level $E'_N$ is equal to or less than 10 dB that is a threshold value, the voice enhancement weight value We is set to 1, and thus the voice signal is not enhanced. However, if the weighted energy level $E'_N$ of the noise signal is greater than 10 dB and equal to or less than 15 dB, the voice enhancement weight value We is set to 1.1. If the weighted energy level $E'_N$ of the noise signal is greater than 15 dB and equal to or less than 20 dB, the voice enhancement weight value We is set to 1.2. If the weighted energy level $E'_N$ of the noise signal is greater than 20 dB and equal to or less than 25 dB, the voice enhancement weight value We is set to 1.3, to thereby enhance the voice signal in proportion to the voice enhancement weight value We.

A difference between the present general inventive concept and a conventional art will now be explained with reference to Equation 9.

When an energy level $E_N$ of a noise signal is 9 dB, since the conventional art considers only the energy level $E_N$ of the noise signal when the voice signal needs to be enhanced, the energy level $E_N$ of the noise signal instead of a weighted energy level $E'_N$ of the noise signal of Equation 9 is compared with 10 dB that is a threshold value. Since the energy level $E_N$ of the noise signal is less than 10 dB, the voice signal is not enhanced.

However, according to the present general inventive concept, if a volume level difference value is 2 even when the energy level $E_N$ of the noise signal is 9 dB, since 9 dB that is energy level $E_N$ of the noise signal is multiplied by 1.2 that is a volume weight value Wv to obtain a weighted energy level $E'_N$ of the noise signal which is 10.8 dB. Since the weighted energy level $E'_N$ of the noise signal is greater than 10 dB that is the threshold value, the voice signal is enhanced 1.1 times.

Accordingly, according to the present general inventive concept, when it is determined that there is no need to enhance the voice signal based only on the energy level $E_N$ of the noise signal, the voice signal may still be enhanced by reflecting the user's input, such as a user's increasing a volume of a receiving unit. Also, when it is determined that there is a need to enhance the voice signal based on the energy level $E_N$, the voice signal can be further enhanced by reflecting the user's demand.

FIG. 10A is a block diagram of a receiving terminal 1000*a* to enhance a voice signal received from a transmitting terminal according to an embodiment of the present general inventive concept.

Referring to FIG. 10, the receiving terminal 1000*a* includes a voice signal receiving unit 1010, a noise signal receiving unit 1020, a noise signal analyzing unit 1030, a volume checking unit 1040, and a voice enhancing unit 1050.

The voice signal receiving unit 1010 receives a voice signal from the transmitting terminal. The voice signal receiving unit 1010 may include one or more wired or wireless ports to receive the voice or audio signal from the transmitting terminal.

The noise signal receiving unit 1020 receives a noise signal around the receiving terminal. In other words, the noise signal receiving unit 1020 receives an input based on the ambient noise or environmental noise around the noise signal receiving unit 1020. Preferably, the noise signal receiving unit 1020 may be a microphone installed in the receiving terminal.

The noise signal analyzing unit 1030 detects an energy level of the noise signal. The energy level of the noise signal may correspond to an amplitude of the noise signal, for example.

The volume checking unit 1040 checks a volume level set by the receiving terminal while the voice signal is received.

The voice enhancing unit 1050 selectively enhances the voice signal based on the energy level of the noise signal and the volume level of the receiving terminal. The voice enhancing unit 1050 may include one or more processors, filters, and supporting logic to enhance the voice signal. Enhancing the voice signal may include increasing an amplitude of the voice signal, for example.

The receiving terminal 1000*a* may include one or more processors or controllers, memory, and supporting logic to control each of the functional units of the receiving terminal 1000*a*.

Figure 10B:
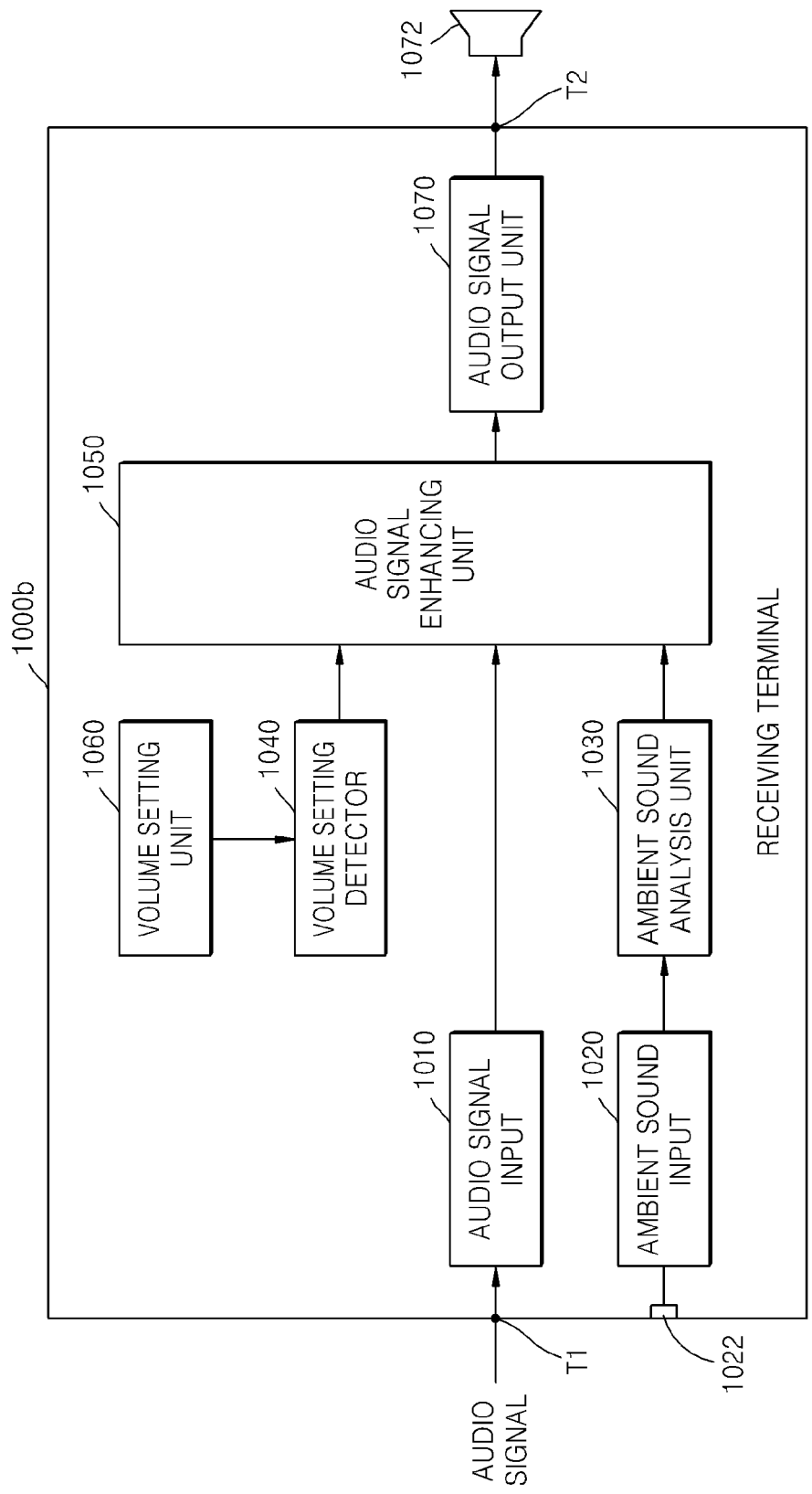
FIG. 10B illustrates a block diagram of a receiving terminal according to another embodiment of the present general inventive concept.
Figure 11:
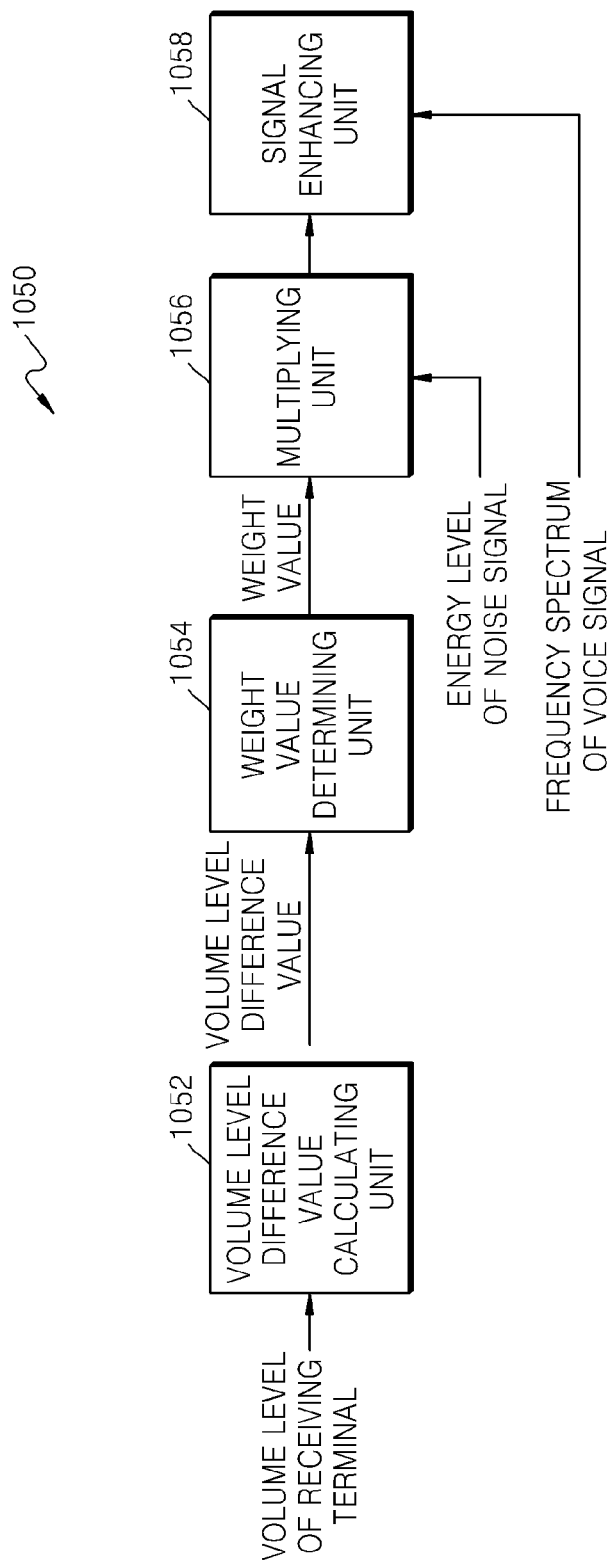
FIG. 11 is a block diagram to illustrate a voice enhancing unit of the receiving terminal of FIG. 10.

FIG. 11 is a block diagram of the voice enhancing unit 1050 of the receiving terminal 1000*a* of FIG. 10A. Referring to FIG. 11, the noise enhancing unit 1050 includes a volume level difference value calculating unit 1052, a weight value determining unit 1054, a multiplying unit 1056, and a signal enhancing unit 1058.

The volume level difference value calculating unit 1052 calculates a volume level difference value by subtracting an average value of volume levels of the receiving terminal in N frames prior to a current frame from a volume level of the receiving terminal in the current frame.

The weight value determining unit 1054 determines a volume weight value based on the volume level difference value of the receiving terminal.

The multiplying unit 1056 multiples an energy level of the noise signal by the volume weight value to obtain a weighted energy level.

The signal enhancing unit 1058 selectively enhances the voice signal based on the weighted energy level.

The signal enhancing unit 1058 may enhance the voice signal by multiplying a frequency spectrum of the voice signal by a voice enhancement weight value. In other words, by multiplying the weight value based on a determined set volume level by an energy level of the noise signal, and by enhancing the voice signal based on a resulting weighted energy level, the receiving terminal 1000*a* may compensate for both a measured noise level and a user's perceived noise level to generate an enhanced voice signal.

FIG. 10B illustrates a receiving terminal 1000*b* according to another embodiment of the present general inventive concept. The receiving terminal 1000*b* may include a first terminal T1 to receive an audio signal from an external device. The terminal T1 may be a wired terminal or a wireless terminal, such as a wireless antenna. The audio signal may be a voice signal or any other audio signal. An audio signal input unit 1010 is connected to the terminal T1 to receive the audio signal from the terminal T1. The audio signal input unit 1010 may include input circuitry including one or more buffers, memory, or signal processors. The audio signal input unit 1010 may be similar to the voice signal receiving unit 1010 of FIG. 10A.

As the audio signal is received via the first terminal T1, an ambient noise signal may be received via a sound receiver 1022, such as a microphone. The sound receiver 1022 may receive the ambient sound or the environmental sound around the receiving terminal 1000*b*, convert the sound to electronic signals, and transmit the electronic signals to the ambient sound input 1020. The ambient sound input 1020 may be similar to the noise signal receiving unit 1020 of FIG. 10A. Like the audio signal input 1010, the ambient sound input 1020 may include input circuitry such as buffers, memory, or signal processors. The signal corresponding to the ambient sound may be transmitted from the ambient sound input 1020 to the ambient sound analysis unit 1030. The ambient sound analysis unit may include one or more filters and processors to determine a bandwidth or frequency spectrum of the ambient sound signal and may divide the ambient sound signal into blocks corresponding to a predetermined duration of time and/or predetermined frequency bands.

The receiving terminal 1060 may include a volume setting unit 1060 including one or more user inputs to adjust a volume of sound output from the receiving terminal 1000*b*. A volume detector 1040, similar to the volume checking unit 1040 of FIG. 10A may determine a volume setting of the volume setting unit 1060. The volume setting data, input audio signal, and ambient noise signal may all be input into an audio signal enhancing unit 1050, similar to the voice enhancing unit of FIG. 10A. The audio signal enhancing unit 1050 may analyze the detected volume setting output from the volume detector 1040 and the analyzed ambient sound signal output from the ambient sound analysis unit 1030 to determine whether to enhance the audio signal. For example, if the audio signal enhancing unit 1050 determines that the ambient sound is above a predetermined threshold, the audio signal enhancing unit 1050 may enhance the audio signal.

In addition, if the audio signal enhancing unit 1050 determines that the volume is above a predetermined threshold, or that the volume has been changed at a predetermined rate, the audio signal enhancing unit 1050 may enhance the audio signal. The audio signal enhancing unit 1050 may enhance the audio signal by increasing an amplitude of the audio signal or reducing amplitudes of frequencies corresponding to the ambient sound, for example. In addition, the audio signal enhancing unit 1050 may include one or more filters and may enhance certain portions or frequency bands of the audio signal based on the ambient sound and the volume level.

After analysis and processing by the audio signal enhancing unit 1050, the audio signal may be output to an audio signal output unit 1070. The audio signal output unit may include one or more audio processors or controllers to convert the audio signal to an output sound signal. The output sound signal may then be output via terminal T2 to a speaker 1072 to output an audible sound.

Figure 12:
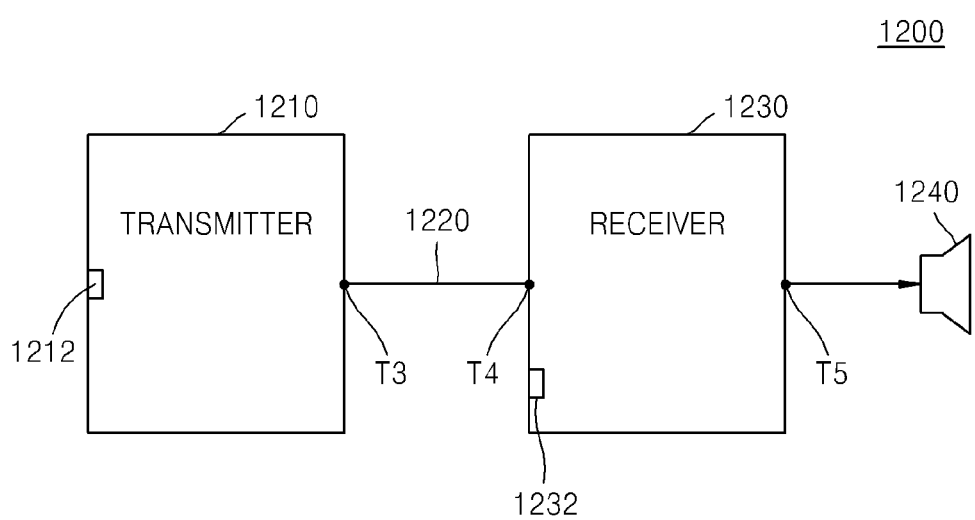
FIG. 12 illustrates an audio signal transmitting and receiving system according to an embodiment of the present general inventive concept.

FIG. 12 illustrates an audio transmitting and receiving system 1200 according to an embodiment of the present general inventive concept. The system may include a transmitter 1210 including an audio input 1212, such as a microphone or electrical connector, to generate or receive an audio signal. The transmitter 1210 may be similar to the apparatus to remove noise 500 of FIG. 5, for example. The transmitter 1210 may output an audio signal via terminal T3. The audio signal may be transmitted via a wired connection 1220 or via a wireless connection to terminal T4 of a receiver 1230. The receiver 1230 may be similar to the receiving terminal 1000*a* or 1000*b* of FIGS. 10A and 10B, respectively. The receiver 1230 may include a microphone 1232 to detect ambient noise and may output a sound signal to a speaker 1240 via output terminal T5.

In the system 1200 illustrate in FIG. 12, each of the transmitter 1210 and the receiver 1230 may include a noise reduction or audio signal enhancing unit, as described above with respect to FIGS. 5, 6, 10A, 10B, and 11. Alternatively, only one of the transmitter 1210 and receiver 1230 may include a noise reduction or audio signal enhancing unit, as described in the above embodiments.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, DVDs, magnetic tapes, floppy disks, and optical data storage devices. The computer-readable recording medium can also be distributed over network coupled computer systems so that the computer-readable code is stored and executed in a distributed fashion. The computer-readable transmission medium may generate carrier waves or signals (e.g., wired or wireless data transmission through the Internet). Also, functional programs, codes, and code segments to accomplish the present general inventive concept can be easily construed by programmers skilled in the art to which the present general inventive concept pertains.

While the present general inventive concept has been particularly shown and described with reference to exemplary embodiments thereof, it will be understood by those of ordinary skill in the art that various changes in form and detail may be made therein without departing from the spirit and scope of the present general inventive concept as defined by the following claims. The preferred embodiments should be considered in a descriptive sense only and not for purposes of limitation. Therefore, the scope of the present general inventive concept is defined not by the detailed description of the general inventive concept but by the appended claims, and all differences within the scope will be construed as being included in the present general inventive concept.

What is claimed is:

1. A method of enhancing a voice signal received from a transmitting terminal, the method being performed by a receiving terminal in a noisy environment, the method comprising:
   detecting an energy level of a noise signal around the receiving terminal;
   checking a volume level set by the receiving terminal while the voice signal is received from the transmitting terminal; and
   selectively enhancing the voice signal based on the energy level of the noise signal and a difference between the volume level and an average of one or more previous volume levels set by the receiving terminal.

2. The method of claim 1, wherein the checking of the volume level set by the receiving terminal comprises:
   dividing the voice signal into a plurality of frames in a time domain; and
   checking the volume level set by the receiving terminal for each of the plurality of frames.

3. A method of enhancing a voice signal received from a transmitting terminal, the method being performed by a receiving terminal in a noisy environment, the method comprising:
   detecting an energy level of a noise signal around the receiving terminal;
   checking a volume level set by the receiving terminal while the voice signal is received from the transmitting terminal; and
   selectively enhancing the voice signal based on the energy level of the noise signal and the volume level,
   wherein the checking of the volume level set by the receiving terminal comprises:
      dividing the voice signal into a plurality of frames in a time domain; and
      checking the volume level set by the receiving terminal for each of the plurality of frames, and
   wherein the selectively enhancing of the voice signal comprises:
      calculating a volume level difference value by subtracting an average value of volume levels of the receiving terminal in N frames prior to a current frame from a volume level of the receiving terminal in the current frame, where N is a number greater than zero;
      determining a weight value based on the volume level difference value;
      multiplying the energy level of the noise signal by the weight value to obtain a weighted energy level; and
      selectively enhancing the voice signal based on the weighted energy level.

4. The method of claim 3, wherein the weight value increases as the volume level difference value increases and is set to 1 when the volume level difference value is equal to or less than a threshold value.

5. The method of claim 3, wherein the selectively enhancing of the voice signal comprises:
   enhancing the voice signal when the weighted energy level exceeds a threshold value; and
   enhancing the voice signal at a rate preset according to the weighted energy level.

6. A receiving terminal to enhance a voice signal received from a transmitting terminal in a noise environment, the receiving terminal comprising:
   a voice signal receiving unit to receive a voice signal from the transmitting terminal;
   a noise signal receiving unit to receive a noise signal around the receiving terminal;
   a noise signal analyzing unit to detect an energy level of the noise signal;
   a volume checking unit to check a volume level set by the receiving terminal while the voice signal is received; and
   a voice enhancing unit to selectively enhance the voice signal based on the energy level of the noise signal and a difference between the volume level and an average of one or more previous volume levels set by the receiving terminal.

7. The receiving terminal of claim 6, wherein the volume checking unit divides the voice signal into a plurality of frames in a time domain and checks the volume level set by the receiving terminal for each of the plurality of frames.

8. A receiving terminal to enhance a voice signal received from a transmitting terminal in a noise environment, the receiving terminal comprising:
   a voice signal receiving unit to receive a voice signal from the transmitting terminal;
   a noise signal receiving unit to receive a noise signal around the receiving terminal;
   a noise signal analyzing unit to detect an energy level of the noise signal;
   a volume checking unit to check a volume level set by the receiving terminal while the voice signal is received; and
   a voice enhancing unit to selectively enhance the voice signal based on the energy level of the noise signal and the volume level, wherein the volume checking unit divides the voice signal into a plurality of frames in a time domain and checks the volume level set by the receiving terminal for each of the plurality of frames, and wherein the voice enhancing unit comprises:
a volume level difference value calculating unit to calculate a volume level difference value by subtracting an average value of volume levels of the receiving terminal in N frames prior to a current frame from a volume level of the receiving terminal in the current frame, where N is a number greater than zero;
a weight value determining unit to determine a weight value based on the volume level difference value;
a multiplying unit to multiply the energy level of the noise signal by the weight value to obtain a weighted energy level; and
a signal enhancing unit to selectively enhance the voice signal based on the weighted energy level.

9. The receiving terminal of claim 8, wherein the weight value increases as the volume level difference value increases and is set to 1 when the volume level difference value is equal to or less than a threshold value.

10. The receiving terminal of claim 8, wherein the signal enhancing unit enhances the voice signal when the weighted energy level exceeds a threshold value and enhances the voice signal at a rate preset according to the weighted energy level.

11. A non-transitory computer-readable recording medium having embodied thereon a program to execute a method, the method comprising:
detecting an energy level of a noise signal around the receiving terminal;
checking a volume level set by the receiving terminal while the voice signal is received from the transmitting terminal; and
selectively enhancing the voice signal based on the energy level of the noise signal and a difference between the volume level and an average of one or more previous volume levels set by the receiving terminal.

12. A method of generating a sound signal, the method comprising:
receiving a voice signal from a transmitting terminal at a receiver;
determining an ambient sound level around the receiver;
determining a set output volume level of the receiver; and
outputting the voice signal as a sound signal based on the ambient sound level and a difference between the determined output volume level and an average of one or more previous volume levels of the receiver.

13. The method of claim 12, wherein determining the ambient sound level includes receiving an ambient sound signal from a microphone connected to the receiver.

14. The method according to claim 12, wherein determining the set output volume level of the receiver includes detecting a volume setting set by a user of the receiver.

15. The method according to claim 12, wherein outputting the voice signal includes:
determining if the ambient sound level exceeds a first predetermined threshold; and
increasing an energy level of the voice signal if it is determined that the ambient sound level exceeds the first predetermined threshold.

16. The method according to claim 15, wherein outputting the voice signal includes:
determining if the set output volume level exceeds a second predetermined threshold; and
increasing the energy level of the voice signal if it is determined that the set output volume level exceeds the second predetermined threshold.

17. A method of generating a sound signal, the method comprising:
receiving an audio signal at a receiver;
determining an ambient sound level around the receiver;
determining a set output volume level of the receiver; and
outputting the audio signal as a sound signal based on the ambient sound level and the determined output volume level,
wherein outputting the audio signal includes:
determining if the ambient sound level exceeds a first predetermined threshold;
increasing an energy level of the audio signal if it is determined that the ambient sound level exceeds the first predetermined threshold;
determining if the set output volume level exceeds a second predetermined threshold; and
increasing the energy level of the audio signal if it is determined that the set output volume level exceeds the second predetermined threshold, and
wherein determining if the output volume level exceeds a second predetermined threshold includes:
dividing the output sound signal into a plurality of frames in the time domain;
determining an energy level of a first frame; and
determining an average energy level of a plurality of second frames that precede the first frame in the time domain to calculate the second threshold.

18. The method according to claim 16, wherein increasing the energy level of the voice signal includes multiplying the voice signal by a weight value greater than 1 if it is determined that the output volume exceeds the second predetermined threshold.

19. An audio signal receiver, comprising:
an audio signal input to receive a voice signal from a transmitting terminal;
an ambient sound input to receive a signal corresponding to an ambient sound around the receiver;
a volume detector to detect a set volume of the receiver; and
an audio signal enhancing unit to enhance the voice signal based on the ambient sound and a difference between the set volume of the receiver and an average of one or more previous set volumes of the receiver.

20. The audio signal receiver according to claim 19, wherein the ambient sound input receives the signal corresponding to the ambient sound from a microphone connected to the audio signal receiver.

21. An audio signal receiver, comprising:
an audio signal input to receive an audio signal;
an ambient sound input to receive a signal corresponding to an ambient sound around the receiver;
a volume detector to detect a set volume of the receiver; and
an audio signal enhancing unit to enhance the audio signal based on the ambient sound and the set volume of the receiver,
wherein the audio signal enhancing unit comprises:
an energy level difference calculating unit to compare an energy level of the audio signal at a first time with an energy level of the audio signal at a previous time;
a weight value determining unit to compare the determined energy level difference with a predetermined threshold and to output a weight value greater than 1 if the energy level difference exceeds the predetermined threshold;
a multiplying unit to multiply an energy level of the ambient sound signal by the weight value; and a signal enhancing unit to multiply the audio signal by the weighted energy level of the ambient sound signal.

* * * * *